(12) United States Patent
Tsern et al.

(10) Patent No.: US 6,701,446 B2
(45) Date of Patent: Mar. 2, 2004

(54) POWER CONTROL SYSTEM FOR SYNCHRONOUS MEMORY DEVICE

(75) Inventors: Ely K. Tsern, Los Altos, CA (US); Richard M. Barth, Palo Alto, CA (US); Craig E. Hampel, San Jose, CA (US); Donald C. Stark, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/887,181

(22) Filed: Jun. 21, 2001

(65) Prior Publication Data

US 2001/0047493 A1 Nov. 29, 2001

Related U.S. Application Data

(63) Continuation of application No. 09/169,378, filed on Oct. 9, 1998, now Pat. No. 6,263,448.
(60) Provisional application No. 60/061,664, filed on Oct. 10, 1997.

(51) Int. Cl.[7] .................................................. G06F 1/04
(52) U.S. Cl. ....................................... 713/501; 713/600
(58) Field of Search ................................ 713/500, 501, 713/600, 300, 322, 502, 503; 712/219

(56) References Cited

U.S. PATENT DOCUMENTS

| 4,528,661 | A | * | 7/1985 | Bahr et al. .................. 370/400 |
|---|---|---|---|---|
| 5,432,468 | A | * | 7/1995 | Moriyama et al. ........... 327/152 |
| 5,452,401 | A | * | 9/1995 | Lin ............................. 395/750 |
| 5,471,607 | A | * | 11/1995 | Garde ........................ 713/600 |
| 5,598,376 | A | * | 1/1997 | Merritt et al. ......... 365/230.06 |
| 5,758,132 | A | * | 5/1998 | Strahlin ...................... 713/501 |
| 5,793,227 | A | * | 8/1998 | Goldrian ...................... 326/94 |
| 5,796,995 | A | * | 8/1998 | Nasserbakht et al. ....... 713/503 |
| 5,802,356 | A | * | 9/1998 | Gaskins et al. ............. 713/500 |
| 5,815,693 | A | * | 9/1998 | McDermott et al. ........ 713/501 |
| 5,884,100 | A | * | 3/1999 | Normoyle et al. ............ 710/52 |
| 5,918,058 | A | * | 6/1999 | Budd .......................... 713/300 |
| 5,987,620 | A | * | 11/1999 | Tran ............................ 713/600 |
| 6,134,638 | A | * | 10/2000 | Olarig et al. ................ 711/167 |
| 6,209,071 | B1 | * | 3/2001 | Barth et al. ................. 711/167 |
| 6,263,448 | B1 | * | 7/2001 | Tsern et al. ................. 713/501 |

FOREIGN PATENT DOCUMENTS

| EP | 94112140.2 | 3/1994 | ................. 1/32 |
|---|---|---|---|
| EP | 96308132.8 | 11/1996 | |

OTHER PUBLICATIONS

PCT Search Report Mar. 3, 1999.

* cited by examiner

Primary Examiner—James P. Trammell
Assistant Examiner—Mary Cheung
(74) Attorney, Agent, or Firm—Gary S. Williams; Pennie & Edmonds LLP

(57) ABSTRACT

A memory device with multiple clock domains. Separate clocks to different portions of the control circuitry create different clock domains. The different domains are sequentially turned on as needed to limit the power consumed. The turn on time of the domains is overlapped with the latency for the memory access to make the power control transparent to the user accessing the memory core. The memory device can dynamically switch between a fast and a slow clock depending upon the needed data bandwidth. The data bandwidth across the memory interface can be monitored by the memory controller, and when it drops below a certain threshold, a slower clock can be used. The clock speed can be dynamically increased as the bandwidth demand increases.

40 Claims, 9 Drawing Sheets

POWER CONTROL SYSTEM FOR SYNCHRONOUS MEMORY DEVICE

This application is a continuation of patent application Ser. No. 09/169,378, filed Oct. 9, 1998, now U.S. Pat. No. 6,263,448, entitled "Power Control System for Synchronous Memory Device," which claimed priority to provisional patent application No. 60/061,664, filed Oct. 10, 1997.

RELATED APPLICATION

A related application was filed on May 7, 1996, Ser. No. 08/648,300, entitled "Asynchronous Request/Synchronous Data Dynamic Random Access Memory", now U.S. Pat. No. 6,209,071, assigned to the same assignee as this application, hereby incorporated by reference as background information.

BACKGROUND OF THE INVENTION

The present invention relates to power domains, and in particular to clock power domains in memory systems such as dynamic random access memories (DRAMs).

Power consumption is a constraint on computer systems both by virtue of limited power available in portable, battery-operated systems, and also limited heat dissipation for high power devices. As devices are made faster by increasing their clock speed, the power requirements also increase since clock signal lines, receivers, and other clock circuits consume more power and generate more heat as device clock rates increase.

Some memory systems operate asynchronously. Other memory systems, to increase the speed and bandwidth, operate synchronously using a clock signal. For these synchronous systems, clock power becomes an important issue at high frequencies. High power consumption by the clock signal can exceed thermal cooling limits of the package or system or cause excessive battery drain in portable devices.

In a prior Rambus dynamic random access memory (DRAM) system, illustrated in FIG. 1, three clock domains are used to control clock power use. FIG. 1 shows a memory core 11 and a memory interface 13. A first domain consists of the control circuitry 15, and a second domain is the write path 17 into the memory core. A third path is read data path 19. Table 1 indicates which clock domains are on for different power modes. The clock power to all three domains can be turned off in a standby mode. The control domain is turned on to enter an active mode. The write data path 17 is additionally turned on when needed for a write operation, an active write mode. Read data path 19 is turned on for a read operation, an active read mode. In a read operation, the control domain is turned on first, to allow the control signals for the read to be provided to the memory core. Since there will be some delay before the data is available, the output data path for the data to be read need not have its clock turned on until some period of time later. Thus, there is a latency between when the control logic is turned on and provided the clock signal to when the read data output path is turned on.

TABLE 1

| | Clock Domains | | |
|---|---|---|---|
| power modes | rclk | sclk | tclk |
| standby | off | off | off |
| active | on | off | off |

TABLE 1-continued

| | Clock Domains | | |
|---|---|---|---|
| power modes | rclk | sclk | tclk |
| active read | on | off | on |
| active write | on | on | off |

In a prior Rambus system, the read data path is turned on automatically by the control logic when the control logic is activated for a read. Thus, a separate control signal does not need to be sent over the interface to turn on the read data path. A register will store a count corresponding to the latency from a RAS control signal to when read data will be available from the memory core, and this register value is used to control the latency of the clock turn-on for the read data path.

One disadvantage of the prior Rambus system is the additional latency required for turning on the control logic to exit the standby power mode. Since the interface control logic and datapath must be on before an incoming command can be processed and a memory operation started, the turn-on latency of the control logic and datapath directly adds to the memory access latency. This provides a power versus latency trade off.

Another method of limiting clock power consumption is to use a slower clock signal. This is done in microprocessors which have a low power or sleep mode. Typically, these are used in laptop computers in which the user can select a lower power mode, or the laptop will automatically enter the lower power or sleep mode in the absence of any user input within a predefined period of time.

SUMMARY OF THE INVENTION

The present invention provides a memory device with multiple clock domains. Separate clocks to different portions of the control circuitry create different clock domains. The different domains are sequentially turned on as needed to limit the power consumed. The turn on time of the domains is overlapped with the latency for the memory access to make the power control transparent to the user access of the memory core.

In one embodiment, the present invention separates out the RAS control logic into a separate clock domain from the CAS control logic. This smaller amount of RAS control logic can then be left on in a standby power mode to eliminate any visible latency from a RAS signal through to data access.

The write and read data paths are also in separate clock domains to further conserve power depending upon whether an operation is a read or write operation.

In one embodiment, the power control is implicit and transparent to the user. In a standby mode, a RAS signal will cause the control logic associated with the RAS control logic to activate the CAS clock domain an appropriate latency after receipt of the RAS signal without any further control over the memory interface required. When a CAS read or write signal is received, that will implicitly, or automatically, cause the read or write clock domain to be turned on an appropriate latency after the CAS signal.

In yet another embodiment of the invention, the memory device can dynamically switch between a fast and a slow clock depending upon the needed data bandwidth. The data bandwidth across the memory interface can be monitored by the memory controller, and when it drops below a certain threshold, a slower clock can be used. The clock speed can be dynamically increased as the bandwidth demand increases. Thus, rather than a coarse switch between a slow or fast clock speed depending upon user activity, clock speed can be switched automatically depending upon data access bandwidth requirements.

For a further understanding of the nature and advantages of the invention, reference should be made to the following description taken in conjunction with the accompanying drawings.

DETAILED DESCRIPTION OF THE PREFERRED EMBODIMENTS

Figure 1:
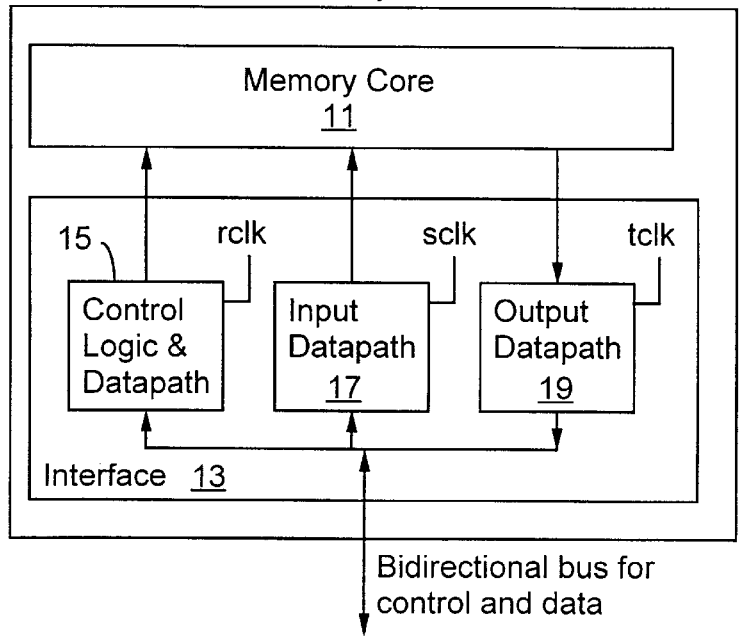
FIG. 1 is a block diagram of a prior art memory system with multiple clock domains.
Figure 2A:
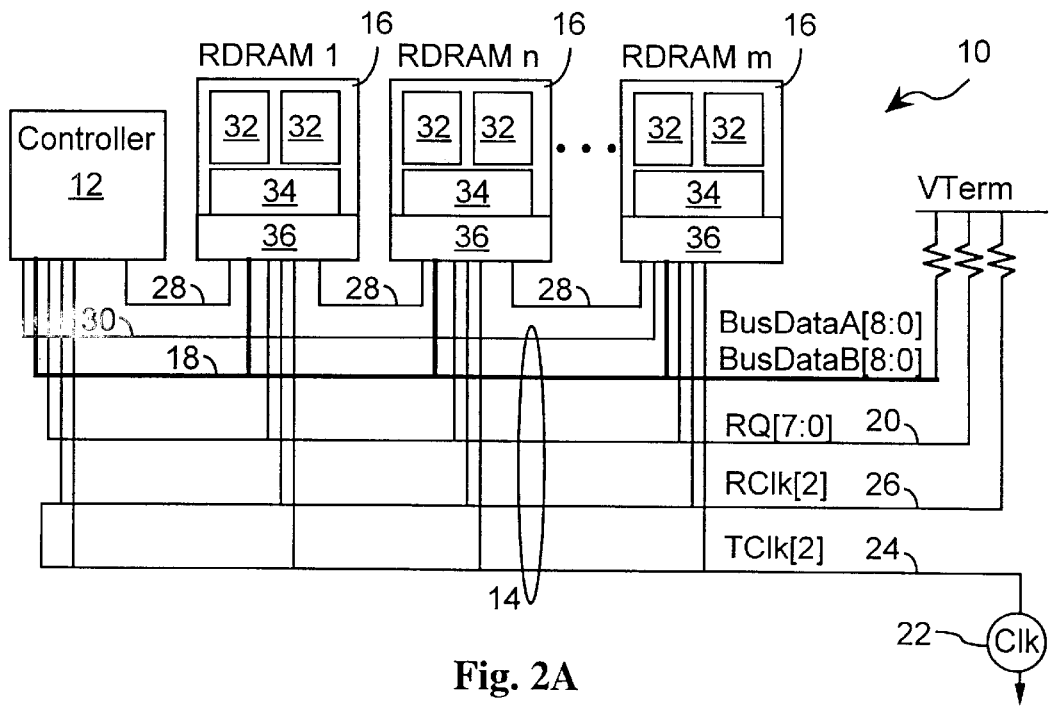
FIG. 2A is a block diagram of a memory system according to one embodiment of the invention.

FIG. 2A shows a memory system 10 which is controlled by a controller 12 over an interconnect bus 14 to a series of RDRAMs (Rambus dynamic random access memories) 16. The interconnect bus 14 includes two nine bit data busses 18 (BusDataA and BusDataB), and an eight bit primary control bus (RQ) 20. A clock 22 is provided in one direction along a transmit line 24 (TClk), and loops back along a receive clock line 26 (RClk).

In addition a low power, serial daisy-chained control interface is provided with daisy-chained segments 28 and a return segment 30. In other embodiments, the control sideband 28, 30 may be a bus instead of daisy-chained. In a powered down or nap mode, the primary control bus and data busses can be turned off with communication being initiated using the control sideband 28, 30.

Each RDRAM 16 includes multiple banks 32 of memory, each with associated core control logic 34. In addition, each chip includes interconnect logic 36.

Figure 2B:
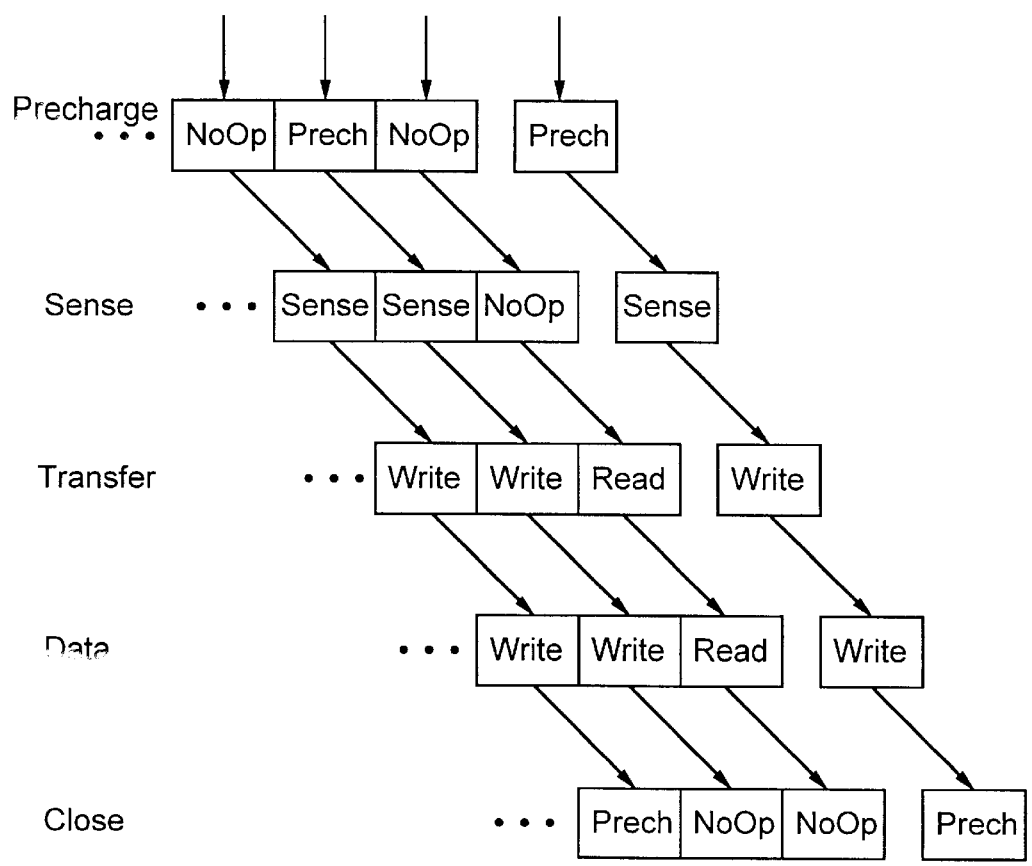
FIG. 2B is a diagram illustrating memory operation pipelining in accordance with the invention.

FIG. 2B illustrates the pipelining of memory operations used in the present invention. As can be seen, the memory operations are broken up into five steps: precharge, sense, transfer, data and close. By breaking up the control and data transfer of a memory access operation in this manner, the operations can be pipelined to increase throughput. For a further description of the pipelining according to the invention, reference should be made to co-pending application Ser. No. 09/169,526, now U.S. Pat. No. 6,356,975, entitled "Apparatus and Method for Pipeline Memory Operations".

Figure 3:
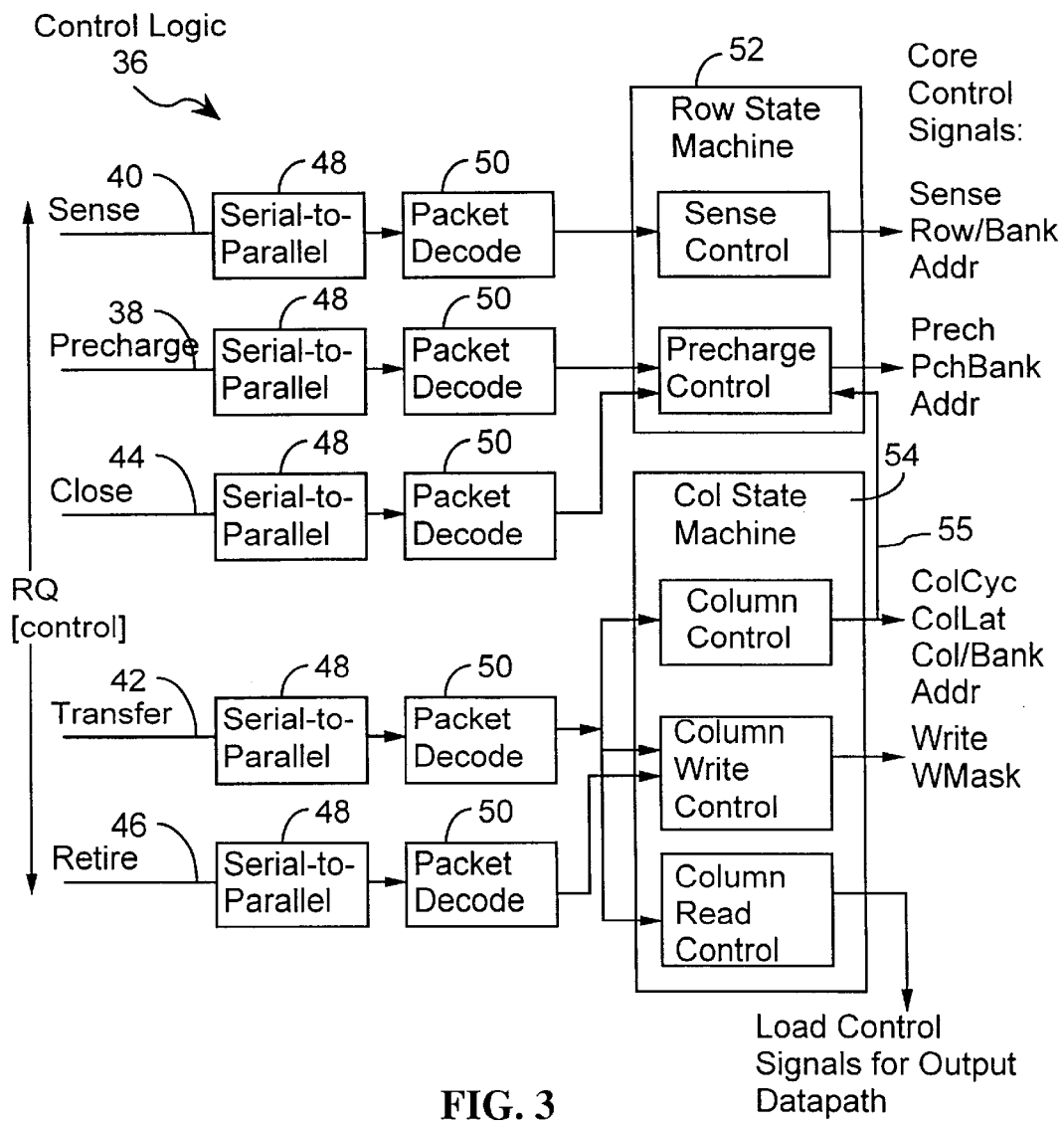
FIG. 3 is a block diagram of one embodiment of the segmentation of the control logic into clock domains according to the access pipelining of FIG. 2.

FIG. 3 is a diagram illustrating one embodiment of interconnect logic 36 in a RDRAM. As can be seen, the control logic is broken up into segments, corresponding to the pipeline stages of FIG. 2B. In particular, there is a pre-charge input 38, a sense input 40, a transfer input 42, and a close input 44. The data pipeline of FIG. 2B is not shown, since FIG. 3 shows only control logic. FIG. 3 additionally shows a retire input 46. This retire input is used for a two-stage write operation, in which data is first written to an internal buffer, and is then written from the buffer into the memory core upon receipt of a "retire" command from the memory controller.

Each of the control inputs is provided on a serial line which is converted into parallel with a respective converter 48. The control signals are sent as a packet, which is decoded in respective packet decode logic 50. From there, decoded control signals are sent to either a row state machine 52, or a column state machine 54. The state machine will then send the appropriate control signals to the memory core control logic.

Not all of the control logic segments shown in FIG. 3 need to be operating at the same time. Even in a tightly pipelined operation, if reads and writes are alternating, for example, only one of the column read and column write control logic needs to be operating each cycle. Accordingly, each of the segments of FIG. 3 can be made a separate clock domain, with the clock to the domain turned on and off as necessary.

The turning off of clock domains as they are not needed significantly reduces power consumption and heat generation of the memory chip. As will be described below with respect to FIGS. 5 and 6, turning on and off of each clock domain is done with timing such that it is transparent to a memory access. In other words, the memory access will take no more time to complete than if all the clocks were left on all the time. An example of how the latency of the clock domain turn on is hidden behind the normal latency of the pipeline is set forth below with respect to FIGS. 5 and 6.

In one embodiment, a sense operation turns on the clock domain for both the precharge control and close logic. A transfer operation (by the column control logic, also sometimes called the CAS control logic) turns on the retire logic (i.e., labeled the column write control logic in FIG. 3). A precharge operation can turn on the column control logic, or parts of it. Signal line 55 in FIGS. 3 and 4 indicates that the control column logic activates the precharge control logic so as to restart precharging (i.e., of the sense amplifiers in the memory core) after the column state machine 54 has completed transfer of information between the sense amplifiers and the data input/output buffers.

Implicit control is also used to turn off clock domains not needed for later steps in a particular operation sequence. For example, a close operation can turn off secondary control domains, such as the transfer and retire logic in the column state machine.

Figure 4:
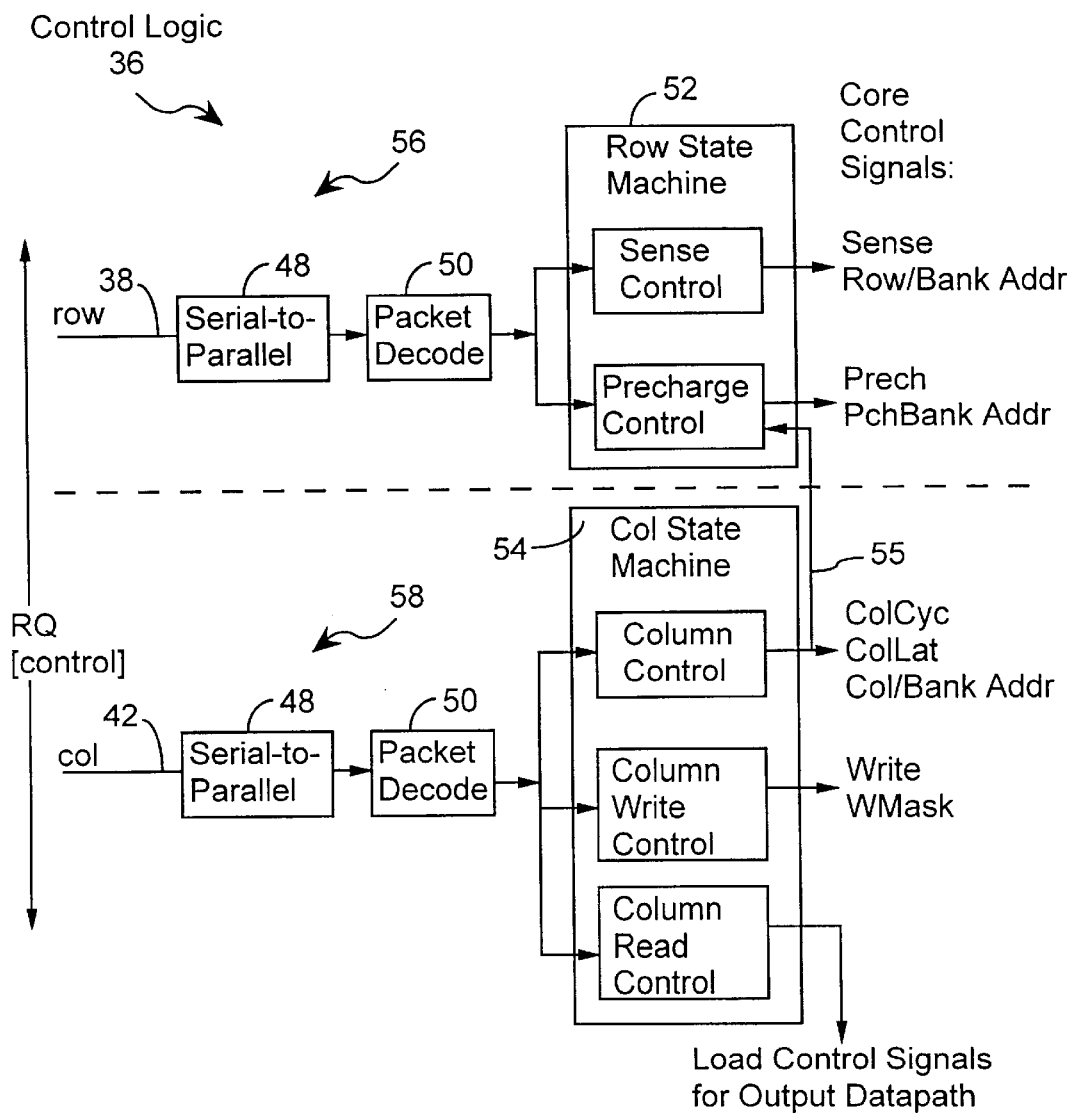
FIG. 4 is a block diagram of an alternate embodiment of FIG. 3 wherein the control logic is broken into two clock domains.

FIG. 4 shows an alternate embodiment of the invention in which the control logic 36 is broken down into two clock domains, row clock domain 56 and column clock domain 58. Row clock domain 56 receives and processes row control packets while column clock domain 58 receives and processes column control packets. Row control packets specify a row address and bank address for a sense operation (also known as a RAS operation), while the column control packets indicate column address and the type of column access operation (e.g., read or write), also known as a CAS operation, to be performed. Such an embodiment reflects a balance between the complexity and cost of more clock domains and the benefits of additional power savings. This embodiment recognizes that the major power savings is achieved by separating the RAS and CAS control operations.

Figure 5:
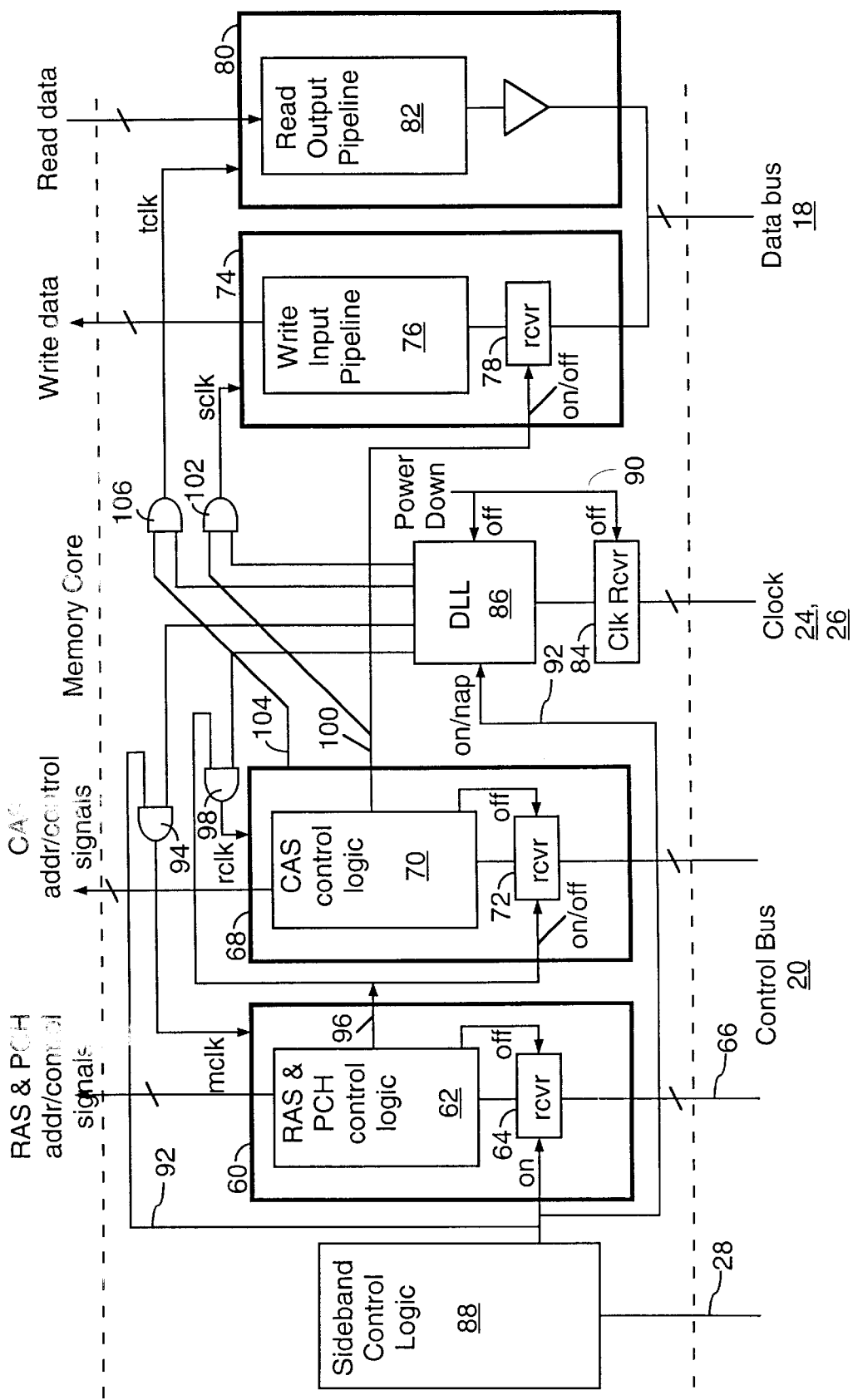
FIG. 5 is a block diagram of multiple control and data access clock domains according to one embodiment of the invention.

FIG. 5 is a block diagram of one embodiment of the invention illustrating the different clock domains. FIG. 5 shows a RAS clock domain 60 including control logic 62 for the RAS signal and PCH(precharge) control logic. In addition, a clock receiver 64 is shown which connects to control bus line 66.

A second, CAS clock domain 68 includes CAS control logic 70 and a receiver 72. A write data clock domain 74 includes a write input pipeline 76 and a receiver 78. A read clock domain 80 includes a read output pipeline 82.

In the middle of FIG. 5 is shown a clock receiver 84 for the main clock used for the main control bus, lines 24 and 26 of FIG. 2A. This clock is synchronized with a delay lock loop (DLL) 86. Finally, a sideband control logic block 88 is shown.

In operation, sideband control logic 88 will always be on, even in a power down mode. In a power down mode, DLL 86 and clock receiver 84 can be turned off via a control line 90. Because of the significant latency required to turn on clock receiver 84 and DLL 86, an intermediate power mode, called a "nap" mode is used in which receiver 84 is on, but DLL 86 is in a low power configuration that provides faster synchronization time than when the DLL is entirely off. When in the nap mode, a memory access can be initiated with an appropriate control signal over sideband control line 28.

In an alternate embodiment, the sideband control logic 88 also receives RAS, or RAS and CAS control data for initiating the memory access, since clock domain 60 will be off when the memory access is initiated. When the sideband control logic 88 receives RAS, but not CAS, control data, the sideband control logic 88 will turn on CAS clock domain 68 so that it is ready when the subsequent CAS signal is sent.

A standby power mode is initiated by an appropriate control packet to sideband logic 88. This will cause DLL 86 to transition from the nap mode to an ON mode via a control signal on line 92. At the same time, RAS clock domain 60 will be turned on by the same line 92 by enabling the gating of the clock signal through AND gate 94. Thus, in standby mode, clock receiver 84 and DLL 86 are on as well as RAS clock domain 60. When a RAS signal is received, it can be immediately processed by RAS logic 62. In anticipation of the subsequent CAS signal, control logic 62 will provide a signal on a line 96 to turn on CAS clock domain 68. This will automatically, or implicitly, turn on the CAS clock domain. Thus, the user need not send special commands to turn on and off the clock domains but rather it is done automatically in accordance with the initiation of a memory access at the appropriate time. The signal on line 96 is sent after a period of time corresponding to the latency of the CAS signal with respect to the RAS signal. This period of time can be stored in a register in RAS control logic 62 or can be determined by the memory controller. The signal on line 96 activates receiver 72, and also turns on the CAS clock domain 68 by activating AND gate 98.

The registers for setting the latency for implicit control of clock power domains can be programmed upon device initialization, or can by dynamically varied. Alternately, instead of a register, the latency can simply be designed into the circuit.

When a CAS signal is received, it will either be a CASR (CAS read) or a CASW (CAS write) signal. If it is a CASW, CAS control logic 70 will activate the write data domain 74 via control line 100, after an appropriate latency corresponding to when the write data will be received from bus 18. Control line 100 turns on receiver 78, and also enables AND gate 102 to provide the clock signal to write data domain 74.

Similarly, for a CASR operation, CAS control logic 70 activates AND gate 106, via a signal on line 104, to provide a clock signal (TCLK) to read clock domain 80.

Thus, in the present invention, when the main control busses are in standby mode, memory accesses can be performed over the fast main control bus, with power mode transitions being implicitly controlled to make the power mode transitions transparent. In this way, core access latencies are overlapped with power turn-on latencies. By automatically turning on certain interface power modes when a particular core operation command is given, implicit power control is provided which minimizes latency and saves valuable control bandwidth (no explicit power control is needed). This will efficiently integrate power control into the memory access pipeline stream.

Figure 6:
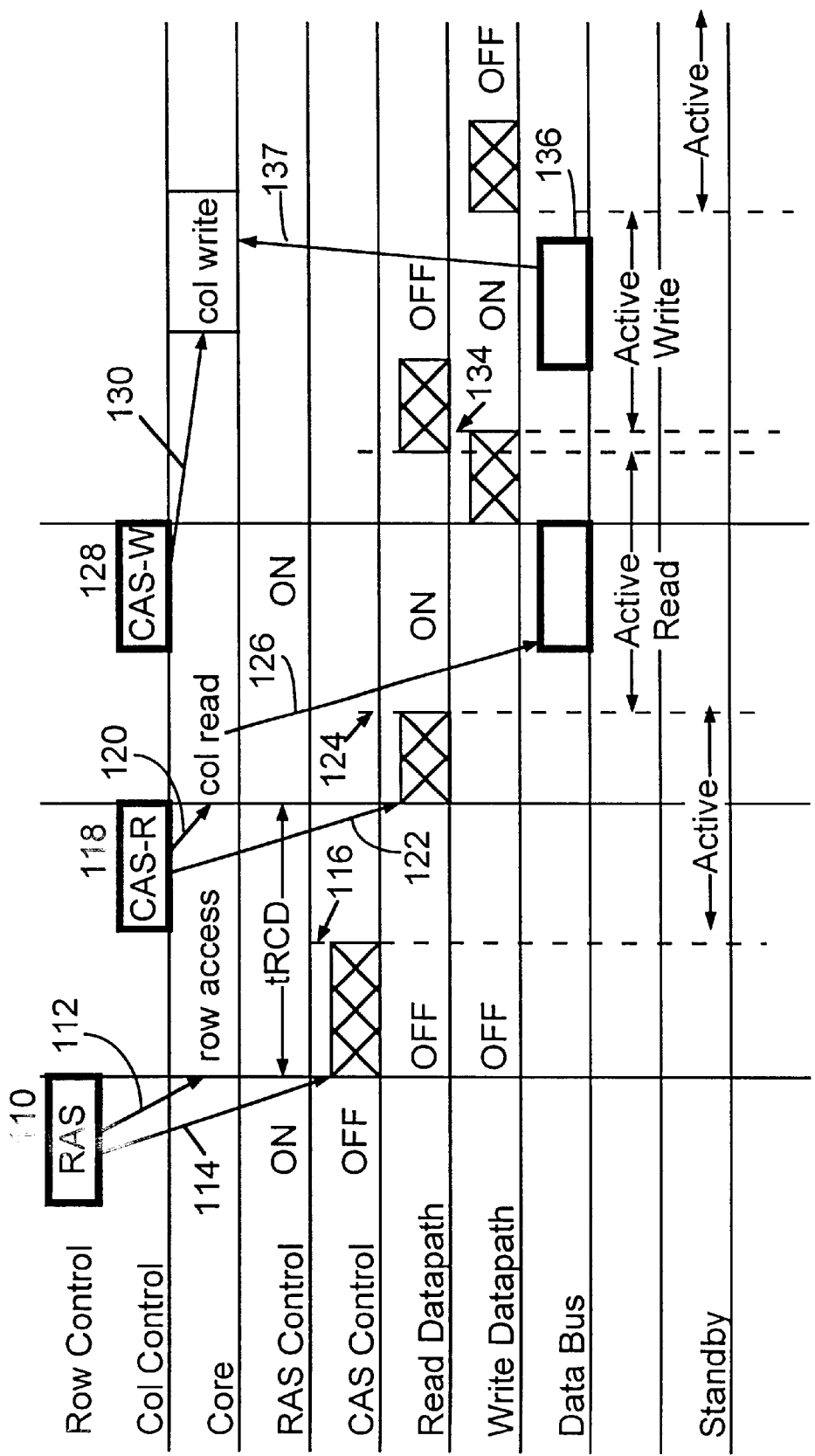
FIG. 6 is a timing diagram illustrating the sequencing of the clock domains of FIG. 5.

FIG. 6 illustrates these overlapped latencies. As shown in FIG. 6, the system of FIG. 5 is initially in a standby mode. When a RAS signal 110 is received, it will initiate the core row access as indicated by arrow 112. At the same time it will turn on the CAS clock domain as indicated by arrow 114. After a turn-on time and programmed latency, the CAS clock will be on at a point in time 116. At this point, the device is in what is considered an "active" mode. This turn-on time 116 is in advance of receiving a CASR signal 118 in its normal, pipeline timing. CAS-R signal 118 initiates a column read as indicated by arrow 120. The column read is initiated at a time tRCD after the row access, which is the latency of the row access. As also shown by an arrow 122, CASR signal 118 will also turn on the read data path after a time delay tDAC corresponding to the latency from the column read until the data is available. Thus, at a point in time 124, the read data path will be on (clock domain 80 of FIG. 5). The device will now be in "active read" mode. Again, the latency from the CAS-R signal to the read data path turn on time 124 matches the latency between the column read and when data is available as indicted by arrow 126.

For a write operation, similar latencies apply, as illustrated by CAS-W signal 128. This will initiate a column write operation as illustrated by arrow 130, and concurrently will provide a control signal as illustrated by line 132 to turn on the write data path. For a write operation, the data is coming in, and thus, the write data path must be turned on at a time 134 in advance of when the write data 136 is received over the data bus. Again, the latency of the power domain turn on of the write data path is transparent or hidden behind the latency of the write data arriving. The write data arriving is also pipelined so that it is not provided until needed for a column write in the memory core, as illustrated by arrow 137.

Slow Clock

Figure 7:
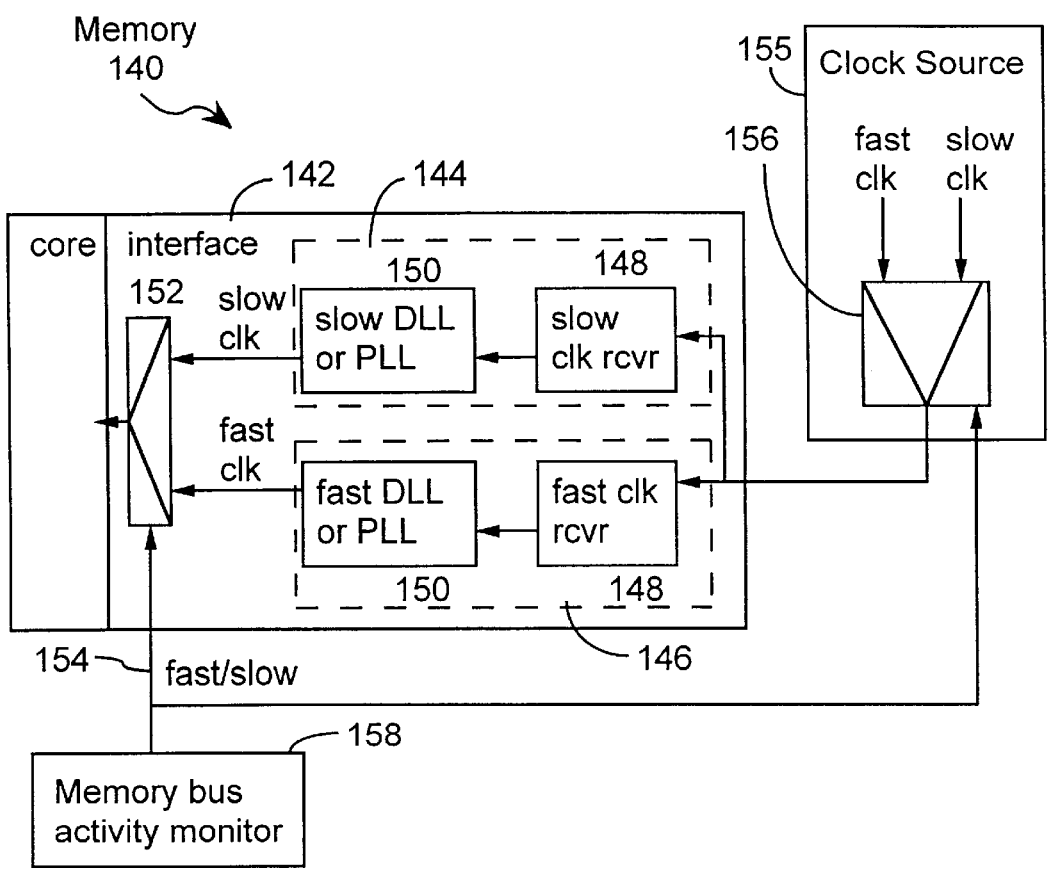
FIGS. 7, 8 and 9 illustrate three embodiments for dynamically varying the clock speed in accordance with data bandwidth.
Figure 8:
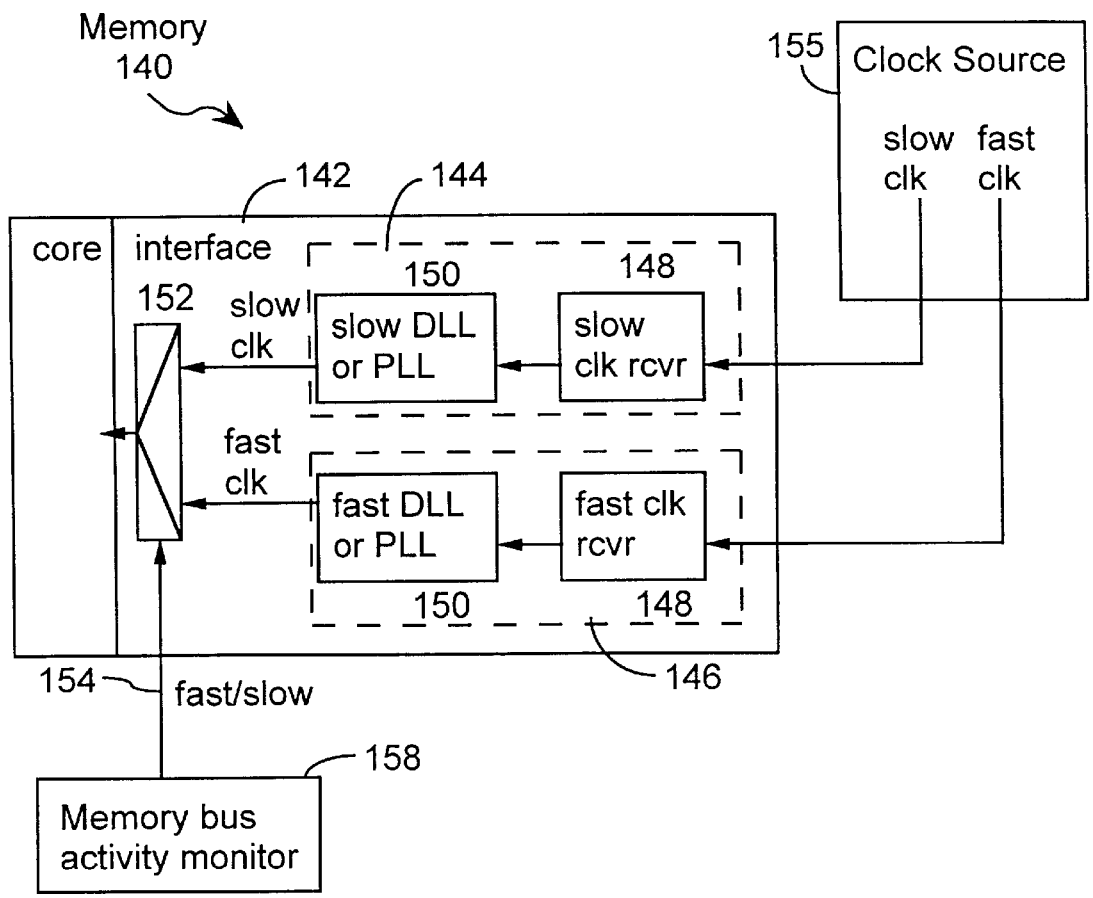
Figure 9:
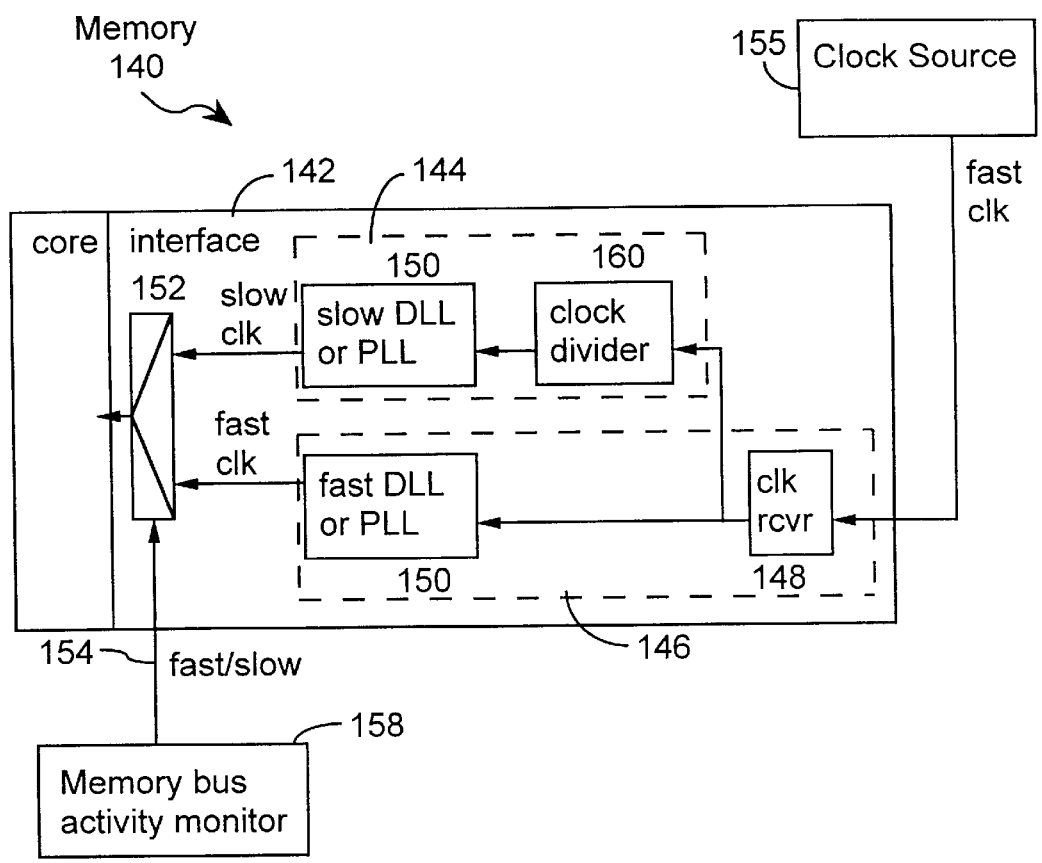

FIGS. 7–9 illustrate embodiments of the invention which allow the clock provided over the main control bus to be dynamically varied from fast to slow in accordance with the data bandwidth requirements. In addition, a slow clock could be used to initiate a memory access operation without requiring the DLL 86 of FIG. 5 to be on, since the slower clock may not need synchronization. The slow clock would enable the access to be started concurrently with the CAS control clock domain being turned on.

A slower clock speed results in lower power because the AC power to switch the capacitive load connected to the clocks is reduced proportionately to the frequency. Also, at reduced clock speeds, the device may not require a high power phase compensation circuit (DLL or PLL), which is typically required for high speed operation. Depending on the slow clock frequency, the interface may operate without phase compensation or use a lesser performance phase compensation circuit which consumes less power.

FIG. 7 illustrates one embodiment in which a memory 140 has an interface 142 with a slow clock input circuit 144 and a fast clock input circuit 146. Each input circuit includes a clock receiver 148 and a DLL or PLL 150. A multiplexer 152 selects whether a fast or slow clock is being used via a select control line 154.

The clock source 155 itself provides both a fast clock and slow clock through a multiplexer 156.

A circuit 158 for selecting between the slow and fast clocks is preferably provided either in the controller or in a memory interconnect or some other device connected to the bus.

By monitoring bus traffic, the amount of bandwidth being used is determined by a monitor circuit 158. When bus traffic exceeds a predefined threshold (i.e., more than a predefined number of memory accesses per second), the monitor circuit selects the fast clock, and otherwise it selects the slow clock. Depending on which clock is used, the fast or slow DLL or PLL and the unused receiver are preferably turned off to conserve power. In one embodiment, the monitor circuit 158 may be implemented using a programmed microprocessor, external to the memory circuit.

As referred to above, on a transition from a slow clock to a fast clock usage, during the latency of the fast clock turn on, operations can be occurring using the slow clock.

FIG. 8 is a variation of the circuit of FIG. 7 where two separate clock inputs are used, rather than a single, multiplexed line for the clock input.

FIG. 9 illustrates an alternate embodiment in which a single external fast clock is provided, which is internally divided using a clock divider circuit 160 to produce the slow clock.

As will be understood by those skilled in the art, the present invention may be embodied in other specific forms without departing from the spirit or central characteristics thereof. Accordingly, the foregoing description is intended to be illustrative, but not limiting, of the scope of the invention which is set forth in the following claims.

What is claimed is:

1. A single chip memory device, comprising:
   a memory core;
   a receiver operably coupled to the memory core, wherein the receiver is operable to receive write data corresponding to write operations that write the write data to the memory core; and
   a control circuit operably coupled to the receiver, wherein the control circuit is operable to energize the receiver in response to receipt of first control information, the first control information indicating a write operation;
   wherein the control circuit is configured to respond to the first control information and to energize the receiver prior to receipt of the write data by the receiver.

2. The memory device of claim 1, wherein the control circuit is operable to enable a clock signal to the receiver in response to receipt of the first control information.

3. The memory device of claim 1, wherein the memory device is a Dynamic Random Access Memory (DRAM).

4. The memory device of claim 1, further comprising a write input pipeline operably coupled to the memory core and the receiver, wherein the control circuit is operable to enable the write input pipeline in response to receipt of the first control information.

5. The memory device of claim 4, wherein the control circuit includes circuitry, activated in response to receipt of the first control information, for enabling a clock signal to the write input pipeline.

6. The memory device of claim 1, further comprising a control signal receiver operably coupled to the control circuit, the control signal receiver operable to receive the first control information.

7. The memory device of claim 6, wherein the control circuit includes a first control circuit and a second control circuit, the second control circuit is operably coupled to the control signal receiver to receive the first control information, and the first control circuit selectively enables the control signal receiver.

8. The memory device of claim 7, wherein:
   the first control circuit is a RAS control circuit that responds to row control data, wherein the RAS control circuit enables the control signal receiver in response to receipt of row control data; and
   the second control circuit is a CAS control circuit that responds to column control data, wherein the first control information includes column control data.

9. The memory device of claim 1, wherein the first control information is received by the control circuit in packet form.

10. The memory device of claim 1, wherein the control circuit energizes the receiver after a predetermined delay following receipt of the first control information.

11. The memory device of claim 10, wherein the predetermined delay includes a programmable latency.

12. The memory device of claim 10, wherein the predetermined delay includes a time period associated with energizing the receiver.

13. The memory device of claim 1, further comprising a read output pipeline operably coupled to the memory core, wherein the control circuit is operable to enable the read output pipeline in response to receipt of second control information, the second control information indicating a read operation.

14. The memory device of claim 13, wherein the control circuit includes circuitry, activated in response to receipt of the second control information, for enabling a clock signal to the read output pipeline.

15. The memory device of claim 13, wherein the control circuit enables the read output pipeline after a predetermined delay following receipt of the second control information.

16. The memory device of claim 15, wherein the predetermined delay includes a programmable latency.

17. The memory device of claim 13, wherein the read output pipeline and the receiver are operable to couple to an external data bus.

18. The memory device of claim 17, wherein the control circuit is operable to couple to an external control bus.

19. A single chip memory device, comprising:
   a memory core;
   a read output pipeline operably coupled to the memory core, wherein the read output pipeline is operable to drive read data received from the memory core onto an external data bus; and
   a control circuit operably coupled to the read output pipeline, wherein the control circuit is operable to enable a clock signal to the read output pipeline in response to receipt of first control information over an external control bus, the first control information indicating a read operation;

wherein the control circuit is configured to respond to the first control information and enable the clock signal prior to receipt of the read data by the read output pipeline.

20. The memory device of claim 19, further comprising a receiver operably coupled to the memory core and the control circuit, the receiver to receive write data from the external data bus, wherein the control circuit is operable to energize the receiver in response to receipt of second control information over the external control bus, the second control information indicating a write operation of the write data to the memory core.

21. The memory device of claim 19, further comprising a receiver operably coupled to the memory core and the control circuit, the receiver to receive write data from the external data bus, wherein the control circuit is operable to enable a write clock signal to the receiver in response to receipt of second control information over the external control bus, the second control information indicating a write operation of the write data to the memory core.

22. The memory device of claim 21, further comprising a write input pipeline operably coupled to the receiver and the memory core, wherein the control circuit is operable to enable the write clock signal to the write input pipeline in response to receipt of the second control information.

23. The memory device of claim 19, wherein the control circuit includes a RAS control circuit and a CAS control circuit, wherein the CAS control circuit is operable to enable the clock signal to the read output pipeline.

24. The memory device of claim 19, wherein the first control information is received over the control bus in packet form.

25. The memory device of claim 19, further comprising a delay locked loop to receive an external clock signal, wherein the delay locked loop generates the clock signal based on the external clock signal.

26. The memory device of claim 25, wherein the delay locked loop is selectively energized based on second control information received by the memory device.

27. A method for operation of a single chip memory device, comprising:
 receiving, over a control bus, first control information indicating a write operation;
 enabling a write clock signal to a receiver in response to receipt of the first control information;
 after enabling the write clock signal, receiving, by the receiver, over a data bus and using the write clock signal, write data corresponding to the write operation; and
 writing the write data to a memory core of the memory device.

28. The method of claim 27, wherein the first control information is received in packet form.

29. The method of claim 27, further comprising enabling the write clock signal to a write input pipeline in response to receipt of the first control information.

30. The method of claim 27, further comprising:
 receiving, over the control bus, second control information indicating a read operation; and
 enabling a read clock signal to a read output pipeline in response to receipt of the second control information.

31. The method of claim 30, further comprising, after enabling the read clock signal, outputting read data onto the data bus using the read output pipeline.

32. The method of claim 27, wherein enabling the write clock signal further comprises waiting a predetermined delay after receipt of the first control information before enabling the write clock signal.

33. The method of claim 32, wherein the predetermined delay includes a programmable latency.

34. A method for operation of a single chip memory device, comprising:
 receiving, over a control bus, first control information indicating a read operation from a memory core of the memory device;
 enabling a read clock signal to a read output pipeline in response to receipt of the first control information; and
 after enabling the read clock signal, outputting read data onto a data bus using the read clock signal and the read output pipeline;
 wherein the receiving, enabling and outputting are preformed within a single chip memory device.

35. The method of claim 34, wherein the first control information is received in packet form.

36. The method of claim 34, wherein enabling the read clock signal further comprises waiting a predetermined delay after receipt of the first control information before enabling the read clock signal.

37. The method of claim 36, wherein the predetermined delay includes a programmable latency.

38. A single chip memory device, comprising:
 a memory core;
 a receiver operably coupled to the memory core, wherein the receiver is operable to receive write data, over a data bus, corresponding to write operations to the memory core; and
 a control circuit operably coupled to the receiver, wherein the control circuit is operable to receive control information over a control bus, wherein the control circuit is operable to enable a clock signal to the receiver in response to receipt of the control information, wherein the control information indicates a write operation;
 wherein the control circuit is configured to respond to the control information and enable the clock signal prior to receipt of the write data by the receiver.

39. The memory device of claim 38, further comprising a write input pipeline operably coupled to the receiver and the memory core, wherein the control circuit is operable to enable the clocks signal to the write input pipeline in response to receipt of the control information.

40. The memory device of claim 39, wherein the control circuit includes:
 a control signal receiver operable to couple to the control bus;
 a RAS control circuit that responds to row control data, wherein the RAS control circuit enables the control signal receiver in response to receipt of row control data; and
 a CAS control circuit operably coupled to the control signal receiver, wherein the CAS control circuit responds to column control data, wherein the control information includes column control data.

* * * * *